(12) United States Patent
Smith et al.

(10) Patent No.: US 6,358,780 B1
(45) Date of Patent: Mar. 19, 2002

(54) SEMICONDUCTOR PACKAGE ASSEMBLIES WITH MOISTURE VENTS AND METHODS OF MAKING SAME

(75) Inventors: John W. Smith, Palo Alto; Christopher M. Pickett, San Jose, both of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/561,727

(22) Filed: May 1, 2000

Related U.S. Application Data

(62) Division of application No. 09/059,662, filed on Apr. 14, 1998, now Pat. No. 6,080,932.

(51) Int. Cl.$^7$ .............................................. H01L 21/44
(52) U.S. Cl. ..................... 438/127; 438/112; 438/124; 438/126
(58) Field of Search ............................... 438/111, 112, 438/121, 122, 123, 124, 125, 126, 127

(56) References Cited

U.S. PATENT DOCUMENTS

| | | | |
|---|---|---|---|
| 3,837,067 A | 9/1974 | Johnston et al. ............. 29/613 |
| 4,866,506 A | 9/1989 | Nambu et al. ................ 357/72 |
| 5,108,784 A | 4/1992 | Anderson et al. ............ 427/96 |
| 5,148,265 A | 9/1992 | Khandros et al. ............ 357/80 |
| 5,148,266 A | 9/1992 | Khandros ..................... 357/80 |
| 5,296,738 A | 3/1994 | Freyman et al. ............ 257/684 |
| 5,446,315 A | 8/1995 | Kazaki et al. .............. 257/687 |
| 5,474,958 A | * 12/1995 | Djennas et al. ............. 438/124 |
| 5,548,087 A | 8/1996 | Dahringer .................. 174/52.4 |
| 5,557,150 A | 9/1996 | Variot et al. ................. 257/787 |
| 5,563,102 A | * 10/1996 | Michael ....................... 438/614 |
| 5,679,977 A | 10/1997 | Khandros et al. .......... 257/692 |
| 5,721,450 A | 2/1998 | Miles .......................... 257/667 |
| 5,742,007 A | 4/1998 | Kornowski et al. ........ 174/52.3 |
| 5,767,446 A | 6/1998 | Ha et al. .................... 174/52.4 |
| 5,796,038 A | 8/1998 | Manteghi .................... 174/52.4 |
| 5,949,141 A | 9/1999 | Farnworth et al. .......... 257/737 |
| 6,090,644 A | * 7/2000 | Moden ......................... 438/127 |

OTHER PUBLICATIONS

John H. Lau and Shi–Wei Ricky Lee, Chip Scale Package (CSP), Design, Materials, Processes, Reliability, and Applications, Chapter 15 Sharp's Chip Scale Package 233–57 (McGraw–Hill 1999).

* cited by examiner

*Primary Examiner*—Kevin M. Picardat
(74) *Attorney, Agent, or Firm*—Lerner, David, Littenberg, Krumholz & Mentlik, LLP

(57) ABSTRACT

A semiconductor chip package includes a semiconductor chip having surfaces and contacts, a layer of a moisture-permeable material bonded to one surface of the chip and a moisture-impermeable encapsulant overlying the moisture-permeable material and at least partially surrounding the chip. The package has exposed exterior surfaces and terminals on at least one of the exposed exterior surfaces which are electrically connected to the contacts. The moisture-permeable material extends to at least one of the exposed exterior surfaces so that moisture may be vented through the moisture-permeable material and out of the package. In certain embodiments, the moisture-permeable material includes a compliant layer having silicone and the moisture-impermeable material includes an epoxy.

6 Claims, 7 Drawing Sheets

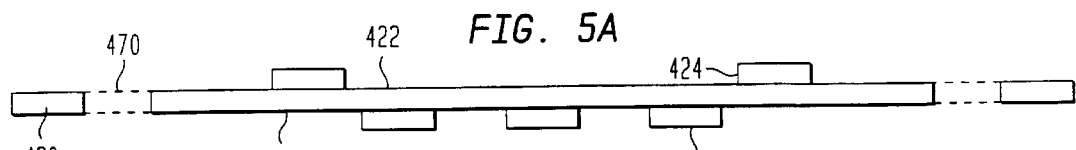
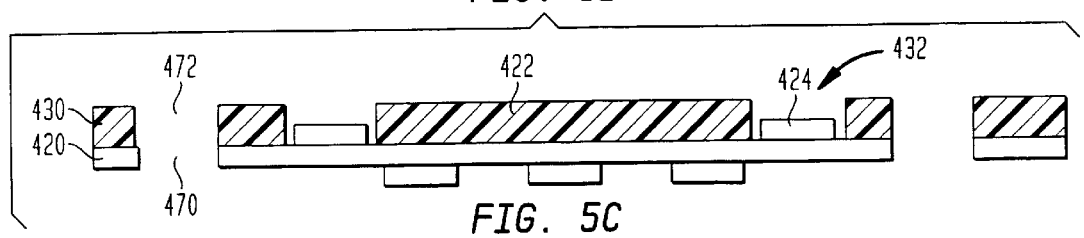
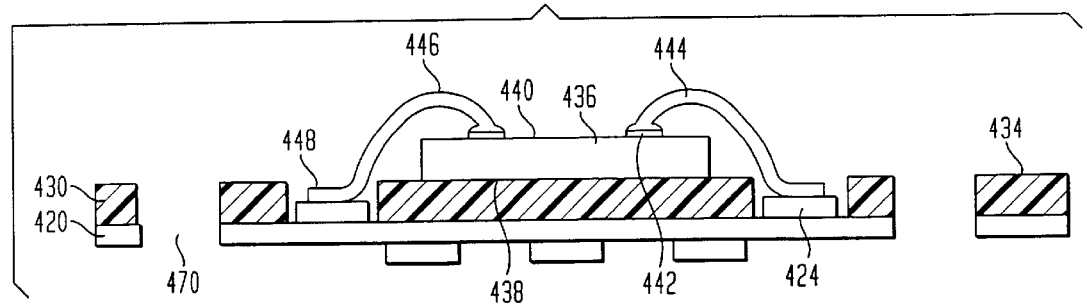

SEMICONDUCTOR PACKAGE ASSEMBLIES WITH MOISTURE VENTS AND METHODS OF MAKING SAME

CROSS REFERENCE TO RELATED APPLICATIONS

The present application is a divisionsl of U.S. patent application Ser. No. 09/059,662, filed Apr. 14, 1998, now U.S. Pat. No. 6,080,932, the disclosure of which is hereby incorporated by reference herein.

The present invention relates to the art of semiconductor chip packaging, and more specifically to semiconductor chip packages having moisture vents and to methods of making such assemblies.

Modern electronic devices utilize semiconductor chips, commonly referred to as "integrated circuits," which incorporate numerous electronic elements. These chips are mounted on substrates which physically support the chips and electrically interconnect each chip with other elements of the circuit. The interconnection between the chip itself and its supporting substrate is commonly referred to as a "first level" assembly or chip interconnection, as distinguished from the interconnection between the substrate and the larger elements of the circuit, commonly referred to as a "second level" interconnection.

The first level interconnection structures connecting a chip to a substrate are typically subject to substantial stresses caused by thermal cycling as temperatures within the device change during operation. The electrical power dissipated within the chip tends to heat the chip and substrate, so that the temperature of the chip and substrate rises each time the device is turned on and falls each time the device is turned off. As the chip and the substrate ordinarily are formed from different materials having different coefficients of thermal expansion, the chip and substrate ordinarily expand and contract by different amounts. This causes the electrical contacts on the chip to move relative to the electrical contact pads on the substrate as the temperature of the chip and substrate changes. This relative movement deforms the electrical interconnections between the chip and substrate and places them under mechanical stress, which can cause breakage of the electrical interconnections. Thermal cycling stresses may occur even where the chip and substrate are formed from like materials having similar coefficiency, of thermal expansion, because the temperature of the chip may increase more rapidly than the temperature of the substrate when power is first applied to the chip.

Certain designs have been directed to reducing problems associated with thermal cycling by redistributing the thermal cycling stress into a portion of the chip package itself. Such designs are shown in commonly assigned U.S. Pat. Nos. 5,148,265; 5,148,266 and 5,679,977, the disclosures of which are hereby incorporated by reference herein. One disclosed embodiment of these patents shows the use of a chip carrier in combination with a compliant layer to reduce the CTE mismatch problems. Typically, the compliant layer includes an elastomeric layer which, in the finished package, is disposed between the chip carrier and the face surface of the chip. The compliant layer provides resiliency to the individual terminals, allowing each terminal to move in relation to its electrically connected chip contact to accommodate CTE mismatch as necessary during testing, final assembly and thermal cycling of the device.

Another problem with conventional epoxy-based (and other hydrophobic compounds) chip package assemblies includes moisture becoming entrapped within the package. Moisture can be introduced into the package through the printed circuit board or substrate, any encapsulant material and especially the adhesive used to attach the chip to the substrate. As a result, when a package having moisture trapped therein heats up during operation, the moisture is rapidly converted into a gas which expands dramatically. This rapid expansion of trapped gas typically causes the chip to delaminate from the substrate and adversely affects the electrical interconnections between the chip and the substrate. This phenomenon is referred to as the "popcorn" effect.

There have been a number of efforts directed to removing moisture trapped within chip packages. U. S. Pat. No. 4,866,506 to Nambu et al. discloses a flat plastic sealed lead frame package having an opening on an underside of the package which allows a die to be exposed to the atmosphere, thereby venting or releasing moisture from the package when the package is subjected to heat.

U. S. Pat. No. 5,296,738 to Freyman et al. discloses a printed circuit board substrate having at least one opening therein, the opening being located directed beneath a semiconductor chip so as to provide means for moisture relief when the chip package is subjected to extreme temperature variations. The opening in the printed circuit board substrate is initially covered on the back side of the printed circuit board with solder resist. The covered opening prevents the flow of die attach material from the top side surface through the opening and on to the back side solder pads. After final assembly of the package, the solder resist must be pierced or punctured to create the final opening for moisture relief.

U. S. Pat. No. 5,721,450 to Miles discloses another chip package having a moisture relief, including a semiconductor die having a top surface and a bottom surface and a substrate for receiving the semiconductor chip. The substrate has an aperture below the chip for providing moisture relief during temperature variations. An adhesive is disposed between the chip and the substrate for mounting the chip to the substrate. The chip is wirebonded to the substrate and an encapsulant for sealing the top surface of the chip is formed over the chip and portions of the substrate.

U.S. Pat. No. 5,557,150 to Variot et al. discloses a method for providing an overmolded semiconductor chip package which prevents delamination of the molding compound from the substrate by allowing the molding compound to flow through holes in the substrate and forming into it rivet-like anchors on the opposite side of the substrate.

Despite the above-mentioned solutions to moisture venting, still further improvements are necessary.

SUMMARY OF THE INVENTION

In one embodiment of the present invention a semiconductor chip package includes a semiconductor chip having surfaces and contacts and a layer of a moisture permeable material bonded to one surface of the chip. The package includes a moisture-impermeable encapsulant overlying the moisture-permeable layer and at least partially surrounding the chip. The moisture-permeable material typically includes a compliant layer, such as an elastomeric polymer or silicone. One such moisture-impermeable encapsulant material includes an epoxy or any other material which does not allow moisture to pass therethrough. The package has exposed exterior surfaces and terminals accessible at least one of the exposed exterior surfaces. The terminals are electrically connected to the contacts, such as by using flexible wire bonds. The moisture-permeable material preferably extends to at least one of the exposed exterior surfaces. In certain embodiments, the semiconductor chip has an upwardly-facing front surface with the contacts thereon and a back surface facing downwardly, with the moisture-permeable material extending beneath the back surface. The package has a downwardly-facing bottom surface and the terminals are being accessible beneath the moisture-permeable material for being connected at the bottom surface of the package. The package preferably includes a rigid or flexible circuit board at the bottom surface thereof, whereby the moisture-permeable material is disposed between the circuit board and the moisture-impermeable material.

In certain embodiments, the package has edge surfaces and the moisture-permeable material extends to at least one of the edge surfaces so that any moisture entrapped within the package is vented through the edge surfaces. In certain embodiments the moisture-permeable material has a non-uniform thickness. For example, the moisture-permeable material may have a substantially flat central region with the chip overlying the central region, and a peripheral region at the package edge surface. The peripheral region at the package edge surface extends upwardly from the circuit board so that the peripheral region of the moisture-permeable material is thicker than the central region.

In certain preferred embodiments, the moisture-permeable material layer has a plurality of apertures extending therethrough, with the terminals extending through at least some of the apertures in said moisture-permeable layer. Each terminal may include a first bump overlying the moisture-permeable material, a post extending through one of the apertures and having an upper end connected to the first bump and a lower end remote therefrom, and a lower bump connected to the lower end of the post. The second bump is desirably beneath the moisture-permeable material. Each upper and lower bump preferably includes a flange portion which extends beyond the diameter of said post and over the respective upper and lower surfaces of the moisture-permeable material. The combination of the first and second bumps and the post generally forms a rivet-shaped terminal. The riveted shape of the terminals serves to reliably secure the moisture-permeable and moisture-impermeable layers together. The first and second bumps may be rounded, may include regions which are substantially flat (e.g. square bumps), or may be any other geometric shape which enhances electrical interconnections.

In further embodiments, the moisture-impermeable material includes a main body overlying the moisture-permeable layer and projections which extend downwardly from the main body and through at least some of the apertures in the moisture-permeable layer so that lower ends of the projections extend beneath the compliant layer. The lower end of each projection preferably includes a lower bump integrally connected thereto. Each lower bump may have a flange portion which extends beyond the diameter of said projection and along the bottom surface of the moisture-permeable layer. Preferably, the combination of each projection and lower bump forms a rivet-shaped element. As described above with respect to the terminals, the riveted shape of the projections serves to "lock-down" or reliably serve the moisture-permeable layer and the moisture-impermeable layer together. In still further embodiments, the rivet shaped terminals or projections may also extend through apertures in a circuit board to "lock-down" and reliably secure the moisture-permeable layer and/or the moisture-impermeable layer and the printed circuit board together.

In other preferred embodiments, a method of making a semiconductor chip package includes providing a semiconductor chip having surfaces and contacts, bonding a layer of a moisture-permeable material to one surface of the chip, bonding a moisture-impermeable encapsulant over the moisture-permeable layer and at least a portion of the chip, providing conductive terminals accessible at one or more exposed exterior surfaces of the package, and electrically interconnecting the terminals and the chip contacts, wherein the moisture-permeable material extends to at least one of the exposed exterior surfaces for venting moisture from the package. As described above, the semiconductor chip preferably has an upwardly-facing front surface with the contacts thereon and a back surface facing downwardly, with the moisture-permeable material extending beneath the back surface of the chip. The package preferably has a downwardly-facing bottom surface, whereby the terminals are disposed beneath the moisture-permeable material for being connected to an external element at the bottom surface of the package. The method may also include providing a circuit board at the bottom surface of the package so that the moisture-permeable layer is disposed between the circuit board and the impermeable material. The method may also include forming the rivet-shaped terminals or projections described above, such as by using the techniques described in U.S. patent application Ser. No. 08/634,464, the disclosure of which is incorporated herein by reference.

The foregoing and other objects and advantages of the present invention will be better understood from the following detailed description of a preferred embodiment taken together with the attached figures.

BRIEF DESCRIPTION OF THE DRAWINGS

FIGS. 5A through 5D show a side view of an alternate method of manufacturing a semiconductor chip package, according to yet further embodiments of the present invention.

FIG. 6 shows a top view of the package shown in FIG. 5C.

DETAILED DESCRIPTION OF PREFERRED EMBODIMENTS

Figure 1A:
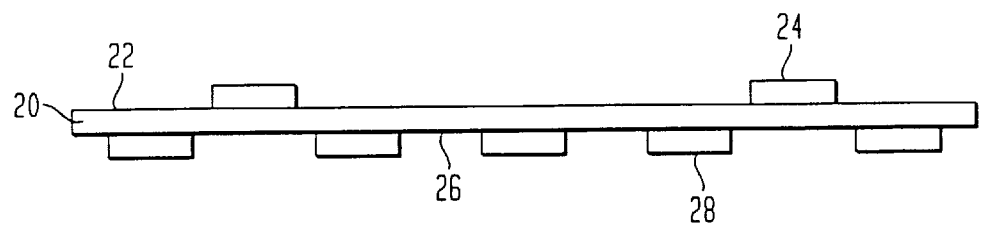
FIGS. 1A through 1D show a side view of a method of manufacturing a semiconductor chip package, according to one embodiment of the present invention.
Figure 1B:
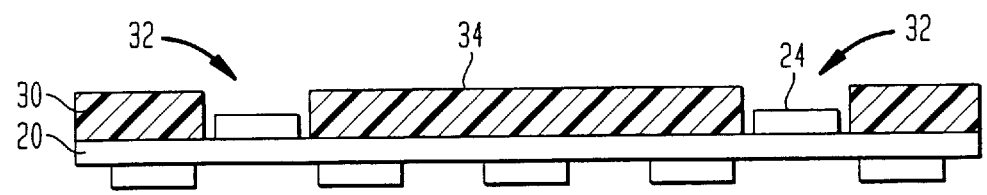

FIGS. 1A–1D show a method of making a semiconductor package with moisture vents according to one preferred embodiment of the present invention. Referring to FIG. 1A, a circuitized substrate 20, such as a rigid printed circuit board or a flexible circuit board, is produced having a first surface 22 including conductive pads 24 and a second surface 26 including conductive terminals 28. The printed circuit board 20 typically includes internal circuitry (not shown) for electrically interconnecting one or more of the conductive pads 24 with one or more of the terminals 28. Referring to FIG. 1B, a layer of a moisture-permeable material 30 is provided over the first surface 22 of the printed circuit board 20. The moisture-permeable layer preferably includes a material which enables moisture to readily pass therethrough such as a composition including silicone or a flexibilized epoxy. The material may also be compliant. The moisture-permeable layer 30 may be applied by a broad number of techniques such as screening/printing the moisture-permeable layer 30 over the first surface 22 of the printed circuit board 20 or by providing the moisture-permeable layer 30 as a substantially continuous layer which is laminated to the first surface 22 of the circuit board 20. The moisture-permeable layer 30 preferably extends to one or more edges of the printed circuit board 20 so that one or more peripheral edges of the moisture-permeable layer are exposed at an exterior surface of the package. The moisture-permeable layer includes apertures 32 formed therein and in alignment with the contact pads 24 so that the contact pads 24 are accessible at a top surface 34 of the moisture-permeable layer 30.

Figure 1C:
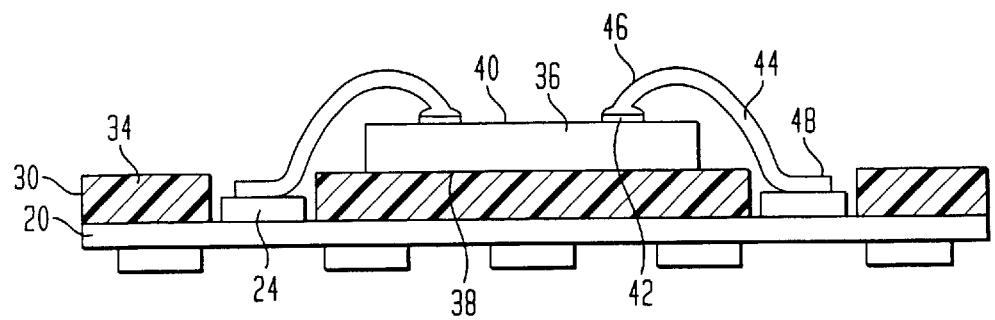

Referring to FIG. 1C, a microelectronic element 36, such as a semiconductor chip, having a rear surface 38 and a front face 40 including contacts 42 is juxtaposed with the top surface 34 of the moisture-permeable layer 30. The rear surface 38 of the chip 36 is then secured over the top surface 34 of the moisture-permeable layer 30. This arrangement is commonly referred to as "back bonding" a semiconductor chip. Next, the chip contacts 42 are electrically interconnected with the contact pads 24 on the printed circuit board 20 using flexible conductive elements 44, such as wire bonds, having first ends 46 connected to the chip contacts 42 and second ends 48 bonded to the contact pads 24 of the printed circuit board 20.

Figure 1D:
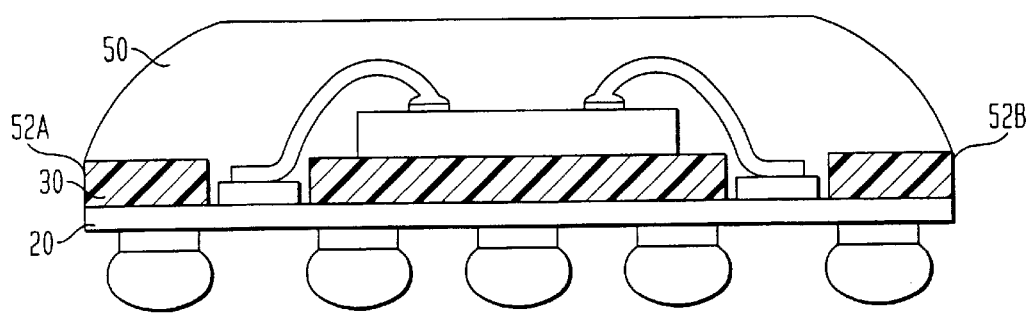

Referring FIG. 1D, the entire assembly is then encapsulated with a moisture impermeable material encapsulant 50. The moisture impermeable encapsulant 50 preferably includes any curable dielectric material which allows little or no moisture to pass therethrough, such as an epoxy. Such epoxy overmolding compounds are commonly used in the packaging industry and can be optimized to ensure high reliability of the flexible conductive elements, e.g. the compounds may allow for the movement or flexing of the wires. As shown in FIG. 1D, one or more edges of the moisture-permeable layer 30 extend to the edges of the printed circuit board 20. Thus, the exposed edges of the package serve as moisture vents 52 for the assembly. As such, any moisture present in the package will pass laterally through the compliant layer 30 to the edges of the layer and out the sides of the package. The FIG. 1D embodiment shows two moisture vents, a first moisture vent 52A on the left side of the assembly and a second moisture vent 52B on the right side of the assembly. However, the moisture vents will preferably extend along substantially the entire periphery of the package. The exterior surface area of the moisture vents 52A and 52B is preferably maximized so as to improve the ability of the moisture-permeable layer 30 to pass moisture therethrough.

Figure 2:
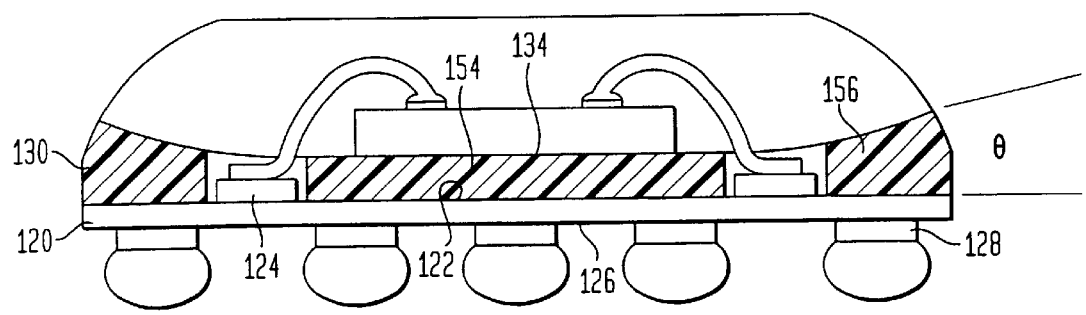
FIG. 2 shows a side view of a semiconductor chip package according to another embodiment of the present invention.

FIG. 2 shows a semiconductor package with moisture vents according to another embodiment of the present invention. The package includes an external circuit element 120, such as a printed circuit board, having a first surface 122 with contact pads 124 and a second surface 126 including terminals 128. A moisture-permeable layer 130 substantially similar to that described above is formed atop the first surface 122 of the printed circuit board 120. The moisture-permeable layer 130 has a central region 154 in which the top surface 134 of the moisture-permeable layer 130 is substantially flat and parallel to the top surface 122 of the printed circuit board 120 and peripheral regions 156 in which the top surface 134 of the moisture-permeable layer extend up and away from the first surface 122 of the printed circuit board at an angle designated by the symbol theta. In other words, the moisture-permeable layer 130 is thicker at the peripheral regions 156, at the edges of the package than at the central region 154 thereof. Maximizing the exterior surface area of the moisture-permeable layer at such edges, maximized the amount of moisture which can pass through the moisture-permeable layer.

Figure 3A:
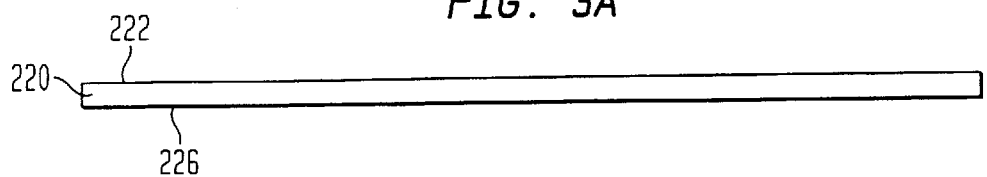
FIGS. 3A through 3D show a side view of another method of manufacturing a semiconductor chip package, according to further embodiments of the present invention.

FIGS. 3A–3D show a method of manufacturing a semiconductor package with moisture vents in accordance with another preferred embodiment of the present invention. Certain steps of the method are disclosed in commonly assigned, copending U.S. patent application Ser. No. 08/634,464, filed Apr. 18, 1996, the disclosure of which is hereby incorporated by reference herein. Referring to FIG. 3A, a sacrificial layer 220 has a first surface 222 and a second surface 226. The sacrificial layer 220 preferably includes a conductive metallic material, such as copper, aluminum, steel, iron, bronze or brass. In FIG. 3A, the sacrificial layer 220 includes a sheet of copper having a substantially uniform thickness of about between 100 to 200 microns. However, the sacrificial layer 220 may be thicker or thinner in other embodiments.

Figure 3B:
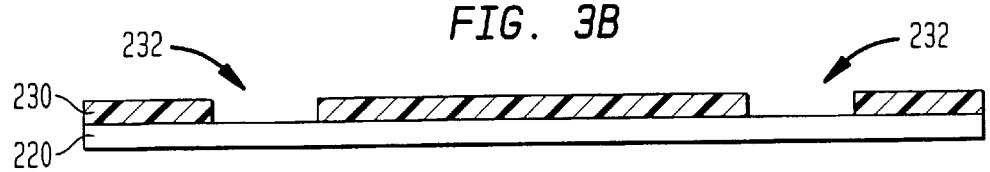

In FIG. 3B, a moisture-permeable layer 230, is provided over the first surface 222 of the copper sheet 220. The moisture-permeable layer 230 includes one or more openings 232 therein so that wire bonds may be electrically interconnected with the copper sheet 220 as will be described in more detail below.

Figure 3C:
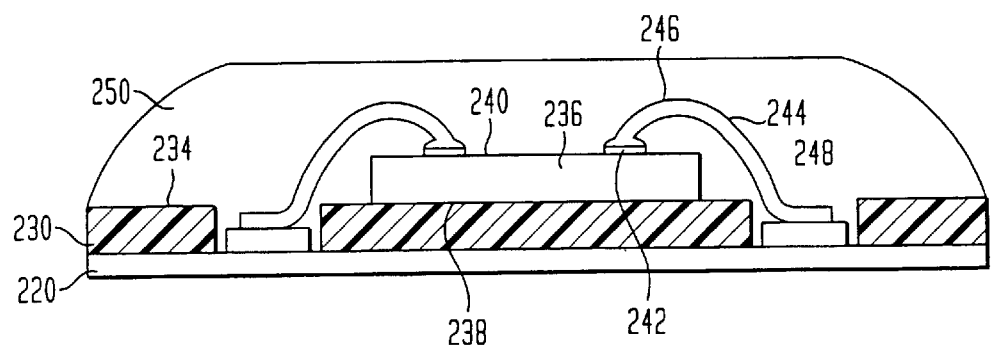

Referring to FIG. 3C, a semiconductor chip 236 having a rear surface 238 and a front face 240 including contacts 242 is next juxtaposed with the top surface 234 of the moisture-permeable layer 230, and the rear surface of the chip 236 is assembled with the top surface 234 of the moisture-permeable layer 230. The chip contacts 242 are then electrically interconnected with the copper sheet 220 by using wire bonding techniques whereby conductive wires 244 have first ends 246 connected to the chip contacts 242 and second ends 248 connected to the copper sheet 220. Next, a curable moisture-impermeable encapsulant 250, such as an epoxy, is provided over the top of the assembly so as to encapsulate the semiconductor chip 236 and the wire bonds 244.

Figure 3D:
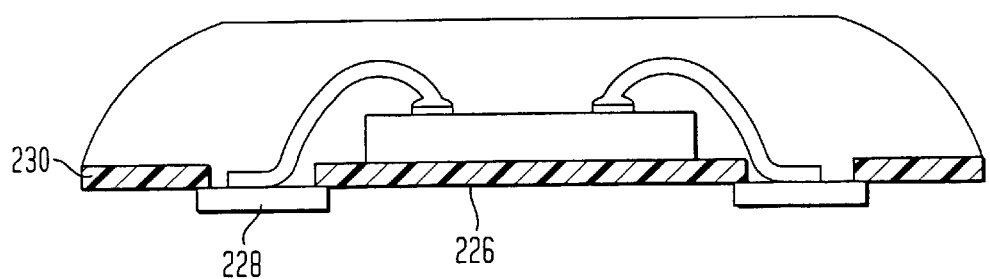

Referring to FIG. 3D, conductive terminals 228 are formed at the bottom surface of the semiconductor package by selectively removing portions of the copper sheet 220. In the particular embodiment shown in FIG. 3D, selected portions of the copper sheet 220 are etched away to leave the conductive terminals 228 accessible at a bottom surface 226 of the assembly. Removing selected portions of copper layer 220 provides additional outlets for moisture venting. After the conductive terminals 228 have been formed, the chip package may be electrically connected to an external circuit element, such as a printed circuit board, by using solder balls or other conductive elements. As depicted, moisture-permeable layer 230 extends to the edges of the package. However, because the moisture-permeable layer 230 is exposed at the bottom face of the package, the moisture-permeable layer can provide a vent for moisture, even if it does not extend to the edges of the package.

Figure 4A:
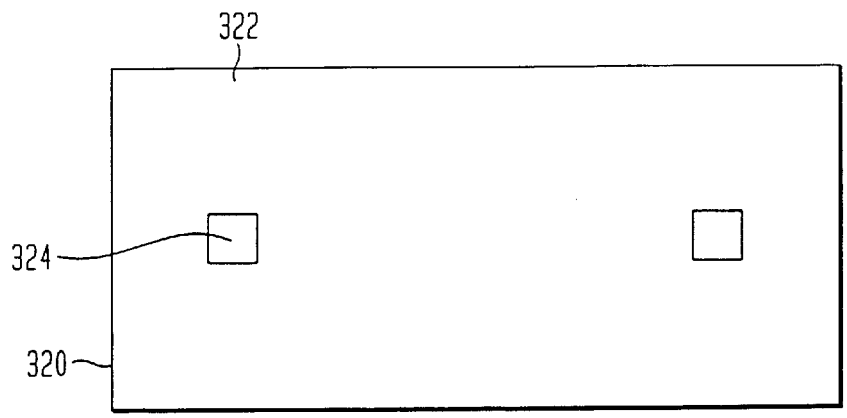
FIGS. 4A through 4C show a top view of another method of manufacturing a semiconductor chip, according to still further embodiments of the present invention.
Figure 4B:
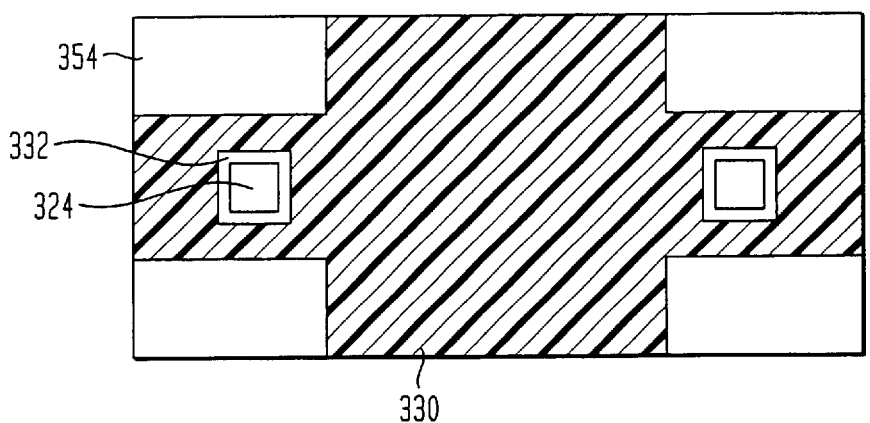
Figure 4C:
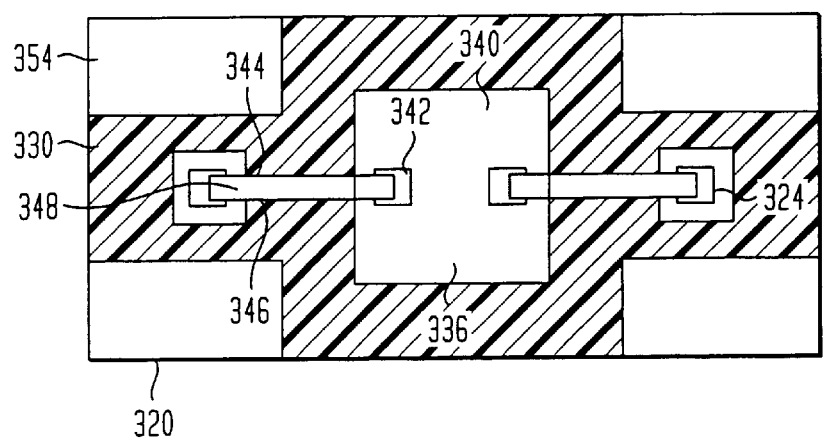

FIGS. 4A–4C show yet another embodiment of a semiconductor package with moisture vents. FIG. 4A shows a top view of an external circuit element 320, such as a printed circuit board, having a first surface 322 and one or more contact pads 324 on the first surface 322 thereof. Referring to FIG. 4B, a moisture-permeable layer 330, is formed over the first surface 322 of the printed circuit board 320. The configuration of the moisture-permeable layer 330 may be modified so that it does not completely cover the top surface 322 of the printed circuit board 320 because it may not be necessary for the moisture-permeable layer to be present at the entire periphery of the package. In FIG. 4B, the moisture-permeable layer is in the shape of a cross and has four projections which extend to the four edges of the printed circuit board 320, however, the moisture-permeable layer 330 does not cover the corners 354 of the printed circuit board 320. In other words, the moisture-permeable layer only has to be present at one or more exposed surfaces of the package to provide a sufficient outlet for moisture trapped within the package. The moisture-permeable layer 330 preferably includes openings 332 therein which are in alignment with the contact pads 324 of the substrate so that the contact pads 324 are accessible through the moisture-permeable layer 330.

Referring to FIG. 4C, a semiconductor chip 336 having one or more contacts 342 on a front face 340 thereof is juxtaposed with the moisture-permeable layer 330, and the rear surface (not shown) of the chip 336 is assembled to the top surface of the moisture-permeable layer. Next, the chip contacts 342 are electrically interconnected with the contact pads 324 of the printed circuit board 320 by using wire bonding techniques, whereby wire bonds 344 have first ends 346 connected to the chip contacts 342 and second ends 348 connected to the contact pads 324. A moisture-impermeable encapsulant 250, similar in composition to that described above, is then provided over the top surface of the substrate, the moisture-permeable layer, the chip and the wire bonds. The moisture-impermeable encapsulant 250 preferably extends to the four corners of the substrate and serves to "lock-down" the chip on the substrate, as disclosed in the above-mentioned '464 patent application, the disclosure of which is hereby incorporated by reference herein. Although the embodiment shown in FIGS. 4A–4C shows the moisture-permeable layer 330 extending to all four edges of the package, in other embodiments, the compliant layer may only extend to one, two or three edges. As described above and shown in FIG. 2, the thickness of the moisture-permeable layer 330 in the vicinity of the edge may be increased to provide more surface area at the exterior edge of the moisture-permeable layer to enhance moisture venting through the moisture-permeable layer. Also, portions of circuit board 320 may be removed to expose regions of the moisture-permeable layer at the bottom surface of the package.

FIGS. 5A–5D show another method of making a semiconductor package with moisture vents according to a further preferred embodiment of the present invention. Referring to FIG. 5A, a circuitized substrate 420, such as a rigid printed circuit board or a flexible circuit board, is provided having a first surface 422 including conductive pads 424 and a second surface 426 including conductive terminals 428. The printed circuit board 420 typically includes internal circuitry (not shown) for electrically interconnecting one or more of the conductive pads 424 with one or more of the terminals 428. The printed circuit board 420 includes one or more apertures 470 extending through the width of the board 420 from the first surface 422 to the second surface 426 thereof. The apertures 470 are preferably positioned in one or more corners or edges of the printed circuit board 420. Referring to FIG. 4B, a moisture-permeable compliant layer 430, comprising materials substantially similar to those described above, is provided over the first surface 422 of the printed circuit board 420. The moisture-permeable layer is substantially continuous and extends to one or more edges of the printed circuit board so that one or more peripheral edges of the moisture-permeable layer are exposed at an exterior surface of the package. The moisture-permeable layer 430 includes first set of apertures 432 which are preferably in alignment with the contact pads 424 so that the contact pads 424 are accessible at a top surface 434 of the moisture-permeable layer 430. The moisture-permeable layer 430 also includes a second set of apertures 472 overlying the one or more apertures 470 extending through the printed circuit board 420.

Referring to FIG. 5C, a microelectronic element 436, such as a semiconductor chip, having a rear surface 438 and a front face 440 including contacts 442 is juxtaposed with the top surface 434 of the moisture-permeable layer 430. The rear surface 438 of the chip 436 is then secured over the top surface 434 of the moisture-permeable layer 430. Next, the chip contacts 442 are electrically interconnected with the contact pads 424 on the printed circuit board 420 using flexible conductive elements 444, such as wire bonds, having first ends 446 connected to the chip contacts 442 and second ends 448 bonded to the contact pads 424 of the printed circuit board 420.

FIG. 6 shows a top view of FIG. 5C illustrating the apertures 472/470 in one or more corners of the printed circuit board 420. The contacts 442 on the chip 436 are electrically connected to the contact pads 424 on the printed circuit board 420 via flexible conductive elements 444.

Referring to FIG. 5D, the entire assembly is then encapsulated with a moisture-impermeable encapsulant 450. The encapsulant 450 preferably includes any curable dielectric material which allows little or no moisture to pass therethrough, such as an epoxy. Such epoxy overmolding compounds are commonly used in the packaging industry and can be optimized to ensure high reliability of the flexible conductive elements, e.g. the compounds may allow for the movement or flexing of the wires. The epoxy overmolding my also be loaded with materials to bring the cured encapsulant's thermal coefficient of expansion ("TCE") closer to the CTE of the silicon chip. The encapsulant 450 is allowed to project through the respective aligned apertures 472 and 470 in the compliant layer 430 and the printed circuit board 420. The encapsulant 450 is allowed to flow laterally along the second surface 426 of the printed circuit board 420 so as to form enlarged heads or bumps 474 of encapsulant material 450 overlying the second surface 426 of the printed circuit board 420. The encapsulant 450 is then cured by heat, UV light, chemical curing or radiation. Once the encapsulant 450 has been cured, the projections or bumps 474 serve to reliably secure or "lock-down" the moisture-permeable layer 430 over the first surface 422 of the printed circuit board 420. In the final assembly, the moisture-permeable layer 430 at the periphery of the package serves as a moisture vent for the assembly. As such, any moisture present in the package will pass laterally through the moisture-permeable layer 430 and out the sides of the package assembly.

Figure 7A:
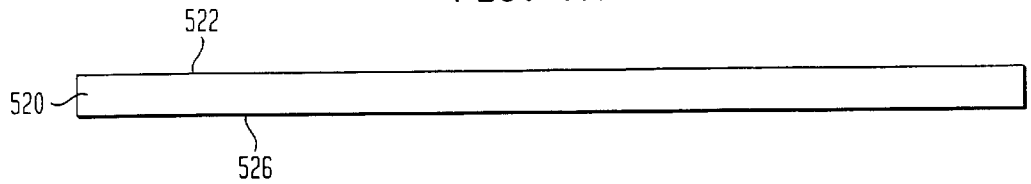
FIGS. 7A through 7E show a side view of an alternate method of manufacturing a semiconductor chip package, according to yet further embodiments of the present invention.
Figure 7B:
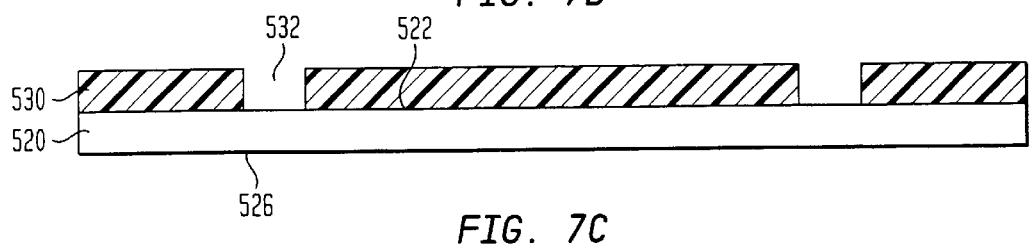
Figure 7C:
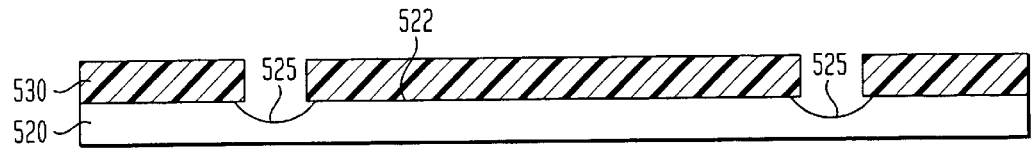

In a further alternative embodiment of the present invention, illustrated in FIGS. 7A–7E, the conductive terminals may have a "rivet-like" shape. FIG. 7A shows a sacrificial layer 520 having a first surface 522 and a second surface 526. The sacrificial layer 520 may include a conductive metallic material, a polymer material or a combination of both. In FIG. 7B, a moisture-permeable compliant layer 530, such as that described above, is disposed on top of the first surface 522 of the sacrificial layer 520. The moisture-permeable layer 530 includes apertures 532 which may be developed and removed using standard photolithographic techniques so as to control the creation and placement of the apertures. The moisture-permeable layer 530 initially serves as an etching mask and a plurality of cavities 525 are removed from the first surface 522 of the sacrificial layer 520. The sacrificial layer 520 preferably includes an etchable layer so that the cavities 525 may simply be etched into the sacrificial layer 520 in the form desired.

Figure 7D:
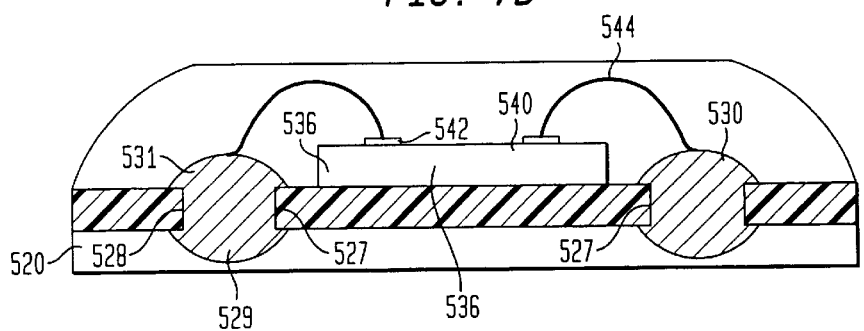
Figure 7E:
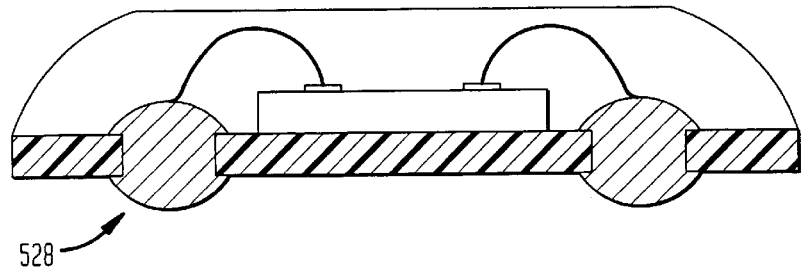
Figure 7F:
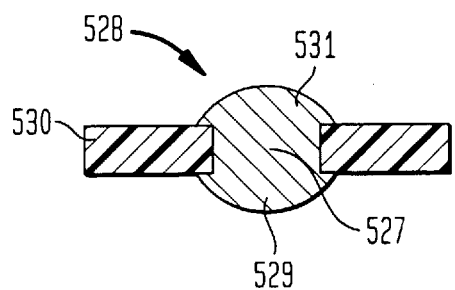
FIGS. 7F and 7G show a side view of alternate embodiments of the terminal structure shown in FIG. 7E, according to the present invention.
Figure 7G:
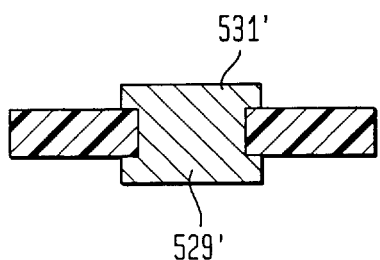

Referring to FIG. 7D, conductive terminals 528 are next plated into the cavities 525 and apertures 532 in the compliant layer 530 so as to create rivet-like terminals. These terminals 528 have a central post 527 extending through the aperture 532 in the compliant layer 530, a bottom bump flange 529 at a lower end of the central post 527 and a top bump flange 531 at an upper end of the central post 527. Both bump flanges have flange areas which extend beyond the diameter of the central post. FIGS. 7F and 7G show alternate cross-sectional terminal configurations, according to the present invention. In the embodiment shown in FIG. 7F, the terminal 528 includes top bump flange 531, central post 527 extending through the aperture in the compliant layer 530 and bottom bump flange 529. In FIG. 7G, the bump flanges 531' and 529' are more squared-off at the edges, as compared to the rounded/oval bump flanges described above. Bump flanges having other shapes may also be used.

Referring to FIG. 7D, a semiconductor chip 536 having contacts 542 on a front face 540 thereof is then back-bonded to the first surface 534 of the compliant layer 530 and electrically connected to the terminals 528 using flexible wire bonds 544, as described above in the earlier embodiments. The chip 536, moisture-permeable layer 530, terminals 528 and wires 544 are then encapsulated as described above. Referring to FIG. 7E, the sacrificial layer 520 is then etched away to leave the conductive terminals 528 accessible at the bottom of the package. As depicted, moisture-permeable layer 530 extends to the edges of the package. However, because the moisture-permeable layer 530 is exposed at the bottom face of the package, the permeable compliant layer can provide a vent for moisture, even if it does not extend to the edges of the package.

Figure 8:
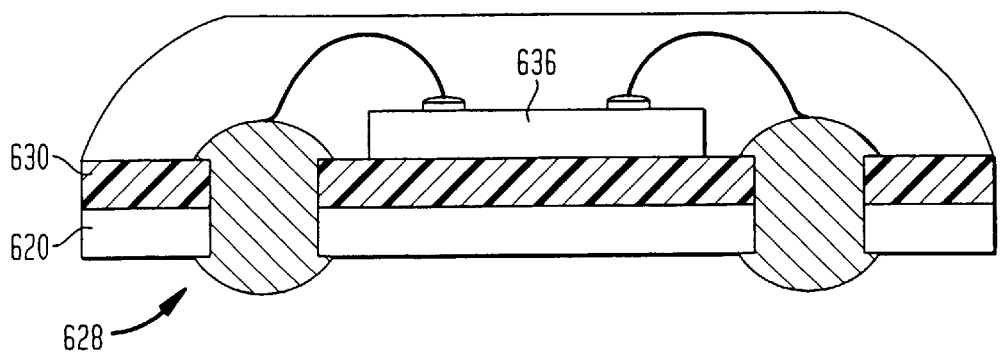
FIG. 8 shows a side view of an alternate method of manufacturing a semiconductor chip package having apertures extending to a bottom surface of the package, according to yet another embodiment of the present invention.

In further embodiments, as shown in FIG. 8 the terminals 628 extend all the way through a substrate 620, such as a printed circuit board. After the chip 636 has been electrically connected to the terminals 628 and the package has been encapsulated, the substrate 620 is not etched away, as shown above in FIGS. 7D and 7E, but is left in place. The substrate 620 enhances the structural integrity of the final assembly. In the final assembly, the moisture-permeable layer 630 at the periphery of the package serves as a moisture vent for the assembly. As such, any moisture present in the package will pass laterally through the moisture-permeable layer 630 and out the sides of the package assembly.

These and other variations and combinations of the features discussed above may be utilized without departing from the present invention as defined herein. For example, any of the package assemblies described above may be manufactured using single semiconductor chips or may be manufactured on a wafer-scale whereby individual packaged chips or packaged multi-chip modules are diced from the wafer after completing the assembly process. Thus, the foregoing description of the preferred embodiments should be taken by way of illustration rather than by way of limitation of invention as set forth herein.

What is claimed is:

1. A method of making a semiconductor chip package comprising the steps of:

providing a semiconductor chip having surfaces and contacts;

bonding a layer of a moisture-permeable material to one surface of the chip;

bonding a moisture-impermeable encapsulant over said moisture-permeable layer and at least a portion of said chip;

providing terminals accessible at one or more exposed exterior surfaces of said package;

electrically interconnecting said terminals and said chip contacts, wherein said moisture-permeable material extends to at least one of said exposed exterior surfaces.

2. The method as claimed in claim 1, wherein said semiconductor chip has an upwardly-facing front surface with said contacts thereon and a back surface facing downwardly, and wherein said package has a downwardly-facing bottom surface, said moisture-permeable material extending beneath said back surface, said terminals being disposed beneath said moisture-permeable material for connection at said bottom surface of said package.

3. The method as claimed in claim 1, further comprising the step of providing a circuit board at said bottom surface, said moisture-permeable material being disposed between said circuit board and said impermeable material.

4. The method as claimed in claim 3, wherein said package has edge surfaces extending upwardly from said circuit board, said moisture-permeable material extending to at least one of said edge surfaces.

5. The method as claimed in claim 1, wherein said moisture-permeable material has a thickness which is non-uniform.

6. The method as claimed in claim 1, wherein said moisture-permeable layer includes a compliant material.

* * * * *

UNITED STATES PATENT AND TRADEMARK OFFICE
CERTIFICATE OF CORRECTION

PATENT NO. : 6,358,780 B1  Page 1 of 1
DATED : March 19, 2002
INVENTOR(S) : John W. Smith and Christopher M. Pickett It is certified that error appears in the above-identified patent and that said Letters Patent is hereby corrected as shown below:

Column 1,
Line 45, "coefficiency" should read -- coefficients --.

Column 2,
Line 54, "moisture permeable" should read -- moisture-permeable --.

Column 5,
Line 41, after "Referring" insert -- to --.

Column 6,
Line 14, after "package" insert -- , --.

Column 10,
Line 17, after "of" insert -- the --.

Signed and Sealed this

Third Day of September, 2002

*Attest:*

*Attesting Officer*

JAMES E. ROGAN
*Director of the United States Patent and Trademark Office*